United States Patent
Chen et al.

(10) Patent No.: US 11,843,907 B1
(45) Date of Patent: Dec. 12, 2023

(54) LINEARIZATION METHOD APPLIED TO A MEMS MICROPHONE SYSTEM

(71) Applicant: Infineon Technologies AG, Neubiberg (DE)

(72) Inventors: Hong Chen, Villach (AT); Niccoló De Milleri, Villach (AT); Andreas Wiesbauer, Poertschach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/805,348

(22) Filed: Jun. 3, 2022

(51) Int. Cl.
| | |
|---|---|
| *H03F 3/00* | (2006.01) |
| *H04R 3/00* | (2006.01) |
| *H04R 1/08* | (2006.01) |
| *H03F 3/183* | (2006.01) |

(52) U.S. Cl.
CPC .............. *H04R 1/08* (2013.01); *H03F 3/183* (2013.01); *H03F 2200/03* (2013.01); *H04R 3/00* (2013.01); *H04R 2201/003* (2013.01)

(58) Field of Classification Search
CPC . H04R 1/08; H04R 3/00; H04R 3/002; H04R 3/04; H04R 3/10; H04R 19/04; H04R 21/02; H04R 17/02; H04R 2201/003; H03F 3/181; H03F 3/183; H03F 3/187; H03F 3/45; H03F 3/50; H03F 3/52; H03F 2200/03
See application file for complete search history.

(56) References Cited

U.S. PATENT DOCUMENTS

| | | | |
|---|---|---|---|
| 7,088,172 B1 | 8/2006 | Lesea et al. | |
| 8,638,249 B2* | 1/2014 | Kropfitsch | H03G 7/06 330/109 |
| 10,222,407 B2* | 3/2019 | Steiner | H04R 19/04 |
| 2003/0230997 A1* | 12/2003 | Hagen | G02B 26/0841 318/599 |
| 2013/0015919 A1* | 1/2013 | Kropfitsch | H03F 1/38 330/260 |
| 2013/0271307 A1* | 10/2013 | Kropfitsch | H03G 3/002 341/158 |
| 2014/0097906 A1 | 4/2014 | Jennings et al. | |
| 2015/0318829 A1* | 11/2015 | Astgimath | H03F 3/505 330/291 |
| 2016/0149542 A1 | 5/2016 | Mucha et al. | |
| 2018/0332377 A1* | 11/2018 | Polo | H03F 3/505 |
| 2019/0098417 A1* | 3/2019 | Littrell | H04R 3/04 |

(Continued)

*Primary Examiner* — Thang V Tran
(74) *Attorney, Agent, or Firm* — Slater Matsil, LLP

(57) ABSTRACT

A microphone includes a MEMS device having an output node for generating an analog voltage in response to an input sound wave or vibration; a source follower having a control node coupled to the output node of the MEMS device, a current path coupled between a first controlled node and a second controlled node, and a bulk node, wherein the first controlled node is configured for providing a microphone output voltage, and wherein the second controlled node is coupled to a reference voltage; a current source coupled to the first controlled node; and a voltage differential between the first controlled node and the bulk node, wherein a nonzero value of the voltage differential is configured such that a first 1% total harmonic distortion (THD) cross-point of the microphone output voltage is greater than a second 1% THD cross-point of the microphone output voltage using a zero value voltage differential.

20 Claims, 10 Drawing Sheets

(56) References Cited

U.S. PATENT DOCUMENTS

| | | | |
|---|---|---|---|
| 2019/0326868 A1* | 10/2019 | Lin | H04R 3/00 |
| 2020/0252035 A1* | 8/2020 | Danioni | H03K 19/018557 |
| 2022/0306457 A1* | 9/2022 | Straeussnigg | H04R 19/04 |

* cited by examiner

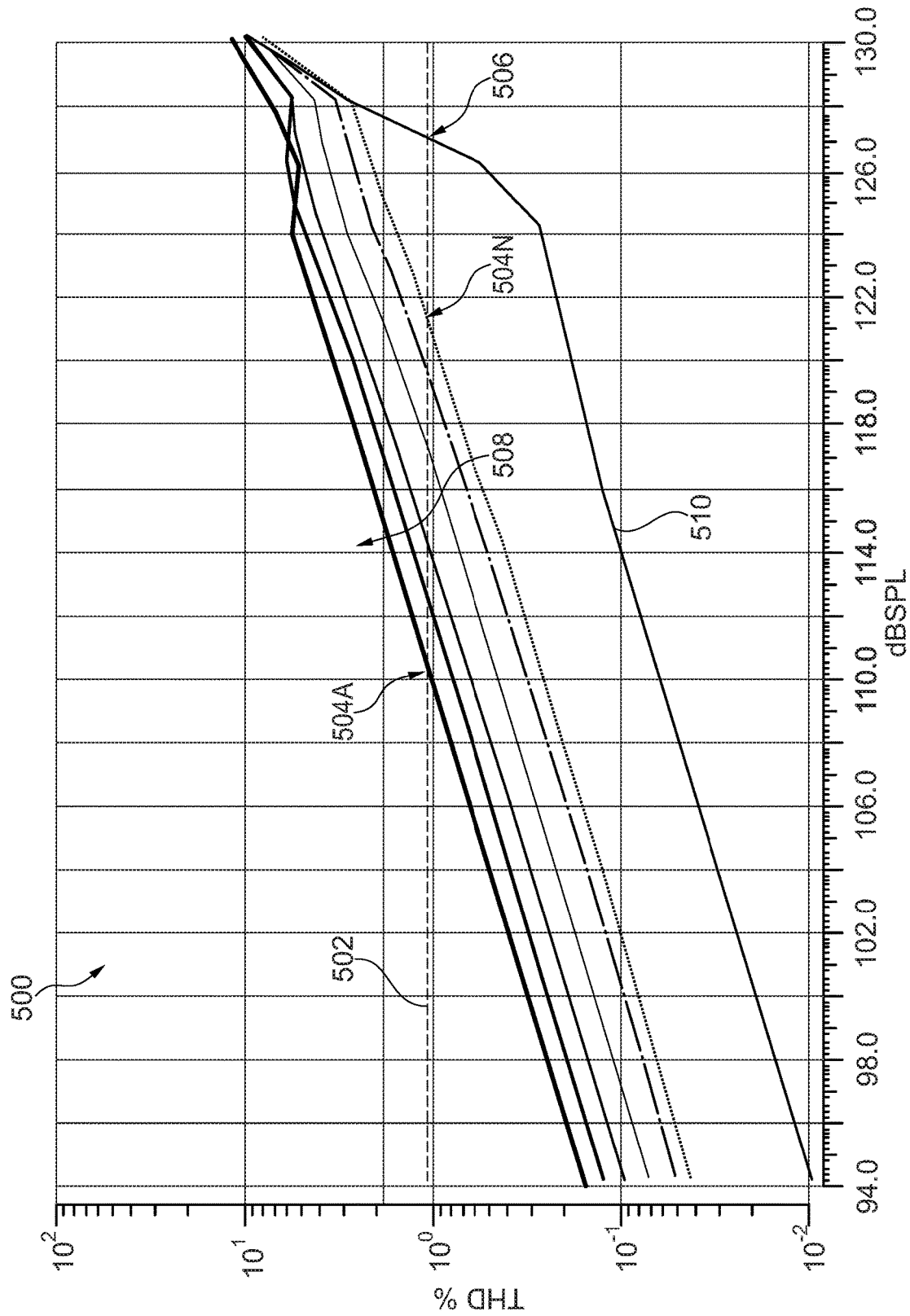

US 11,843,907 B1

LINEARIZATION METHOD APPLIED TO A MEMS MICROPHONE SYSTEM

TECHNICAL FIELD

The present invention relates generally to a linearization apparatus and method applied to a Microelectromechanical System (MEMS) microphone system.

BACKGROUND

Single-ended MEMS microphones are known in the art. Single-ended MEMS microphones typically comprise a capacitive MEMS device including a static membrane and a flexible membrane that are used for converting ambient sound waves into an analog voltage between the two membranes. The analog signal from the MEMS device is initially amplified by a readout circuit including, for example a source follower amplifier. The amplified analog voltage is then typically converted into a digital signal, which is further processed by additional digital signal processing components. Single-ended MEMS microphones are widely used in many consumer applications with studio-quality audio for smartphone or earbud form factors, for example. However, at some volume levels and at operating frequencies single-ended MEMS microphones can suffer from prominent 2nd order harmonic distortion (HD2).

SUMMARY

According to an embodiment, a microphone comprises a MEMS device having an output node for generating an analog voltage in response to an input sound wave or vibration; a source follower having a control node coupled to the output node of the MEMS device, a current path coupled between a first controlled node and a second controlled node, and a bulk node, wherein the first controlled node is configured for providing a microphone output voltage, and wherein the second controlled node is coupled to a reference voltage; a current source coupled to the first controlled node; and a voltage differential between the first controlled node and the bulk node, wherein a nonzero value of the voltage differential is configured such that a first 1% total harmonic distortion (THD) cross-point of the microphone output voltage is greater than a second 1% THD cross-point of the microphone output voltage using a zero value voltage differential.

A microphone comprises a MEMS device having an output node for generating an analog voltage in response to an input sound wave or vibration; a source follower having a control node coupled to the output node of the MEMS device, a current path coupled between a first controlled node and a second controlled node, and a bulk node, wherein the first controlled node is configured for providing a microphone output voltage, and wherein the second controlled node is coupled to a reference voltage; a current source coupled to the first controlled node; and a multiplexer having a plurality of inputs configured for receiving a respective plurality of predetermined bulk voltages, and an output coupled to the bulk node of the source follower, wherein one of the predetermined bulk voltages is selected so that a first 1% total harmonic distortion (THD) cross-point of the microphone output voltage is greater than a second 1% THD cross-point of the microphone output voltage using a zero value voltage differential between a source node of the source follower and the bulk node of the source follower.

According to an embodiment a method comprises generating an analog voltage with a MEMS device in response to an input sound wave or vibration; generating a microphone output voltage with a transistor in a source follower configuration in response to the analog voltage generated by the MEMS device; and adjusting a nonzero voltage of a bulk node of the transistor, so that a first 1% total harmonic distortion (THD) cross-point of the microphone output voltage is greater than a second 1% THD cross-point of the microphone output voltage using a zero voltage differential between a source of the transistor and the bulk node of the transistor.

BRIEF DESCRIPTION OF THE DRAWINGS

For a more complete understanding of the present invention, and the advantages thereof, reference is now made to the following descriptions taken in conjunction with the accompanying drawings, in which:

FIG. 5 is a graph of the total harmonic distortion of an ideal MEMS microphone using bulk biasing;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same or similar elements have been designated by corresponding references in the different drawings if not stated otherwise.

As noted above, single-ended MEMS microphones can suffer from prominent 2nd order harmonic distortion (HD2), especially in the case of low-mid input sound pressure. In constant-charge readout circuits the HD2 is strongly related to the total equivalent parasitic capacitance at the connection node between MEMS itself and the readout Application-Specific Integrated Circuit (ASIC). Since the parasitic capacitance can never be completely eliminated, HD2 compensation circuitry on the ASIC is needed to improve the overall system linearity.

According to embodiment concepts, an extra HD2 component is added to the ASIC, in order to cancel out the MEMS intrinsic HD2. The newly-added HD2 component matches the amplitude of MEMS HD2 component, but is out of phase (180° phase shift) with the MEMS HD2 component. The embodiment concepts, as well as implementation embodiments are described in further detail below.

Figure 1:
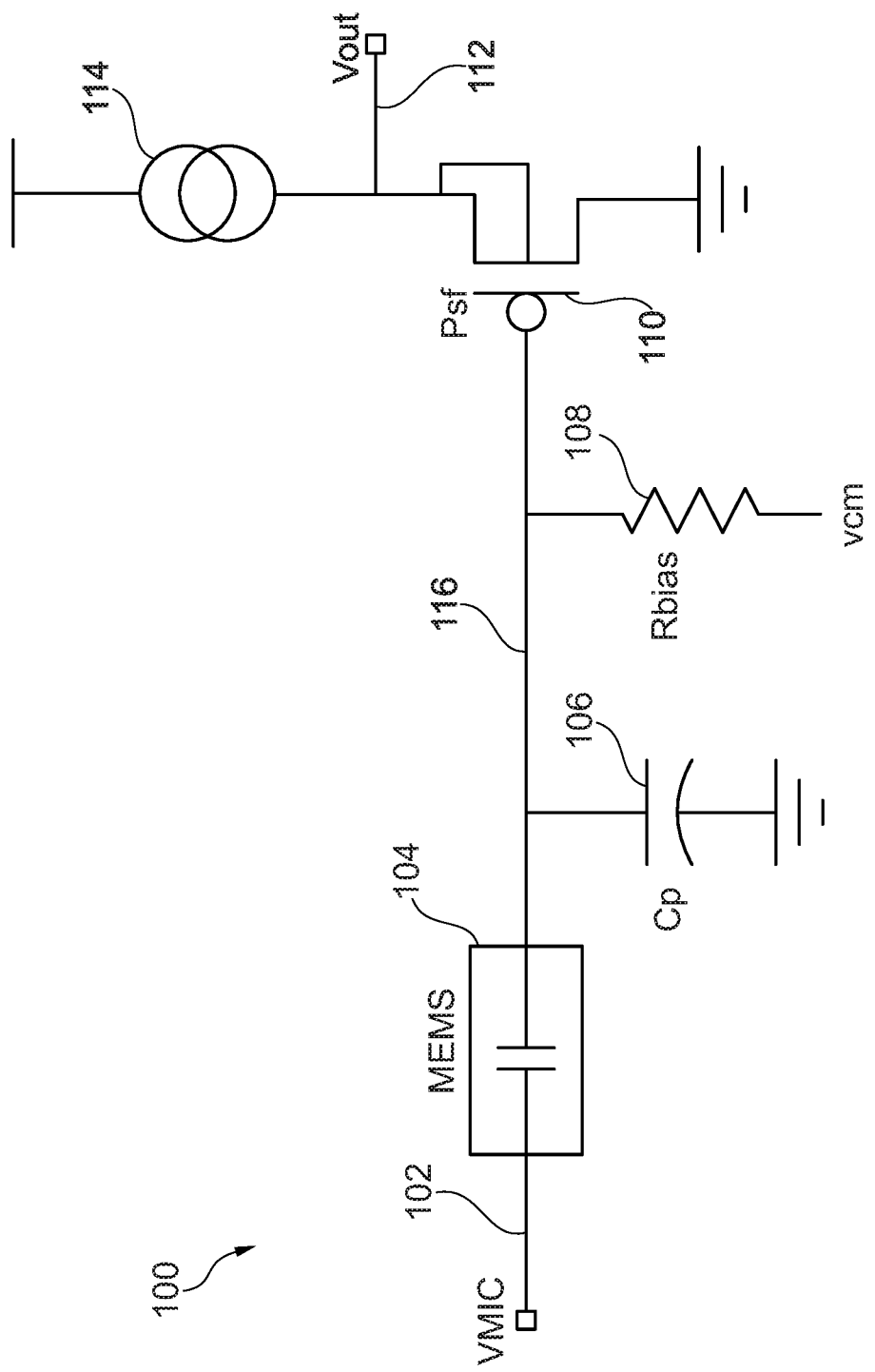
FIG. 1 is a schematic diagram of an exemplary MEMS microphone system.

FIG. 1 shows a schematic diagram of an exemplary MEMS microphone readout circuit 100, including a MEMS capacitive sensor 104. MEMS capacitive sensor 104 receives a bias voltage VMIC at node 102 for appropriately biasing the static and moveable membranes of the sensor. The output of MEMS capacitive sensor 104 is coupled to node 116. The equivalent parasitic capacitor is shown as a lumped element coupled to node 116, noted as parasitic capacitor Cp. A bias resistor 108 is coupled between node 118 and a source of common mode voltage (vcm). The gate of a source follower transistor Psf, which is a PMOS transistor, is also coupled to node 116. The source of source follower transistor Psf provides the low impedance output voltage at node 112 (Vout), and to a bias current source 114. The drain of source follower transistor Psf is coupled to ground. It is important to note that the bulk terminal of the source follower transistor Psf is shorted to the source terminal at node 112. This is a conventional configuration of a PMOS source follower transistor, with the purpose of eliminating the body effect and thus the potential distortion introduced by gmb and vbs shown in the equivalent circuit of FIG. 2.

Figure 2:
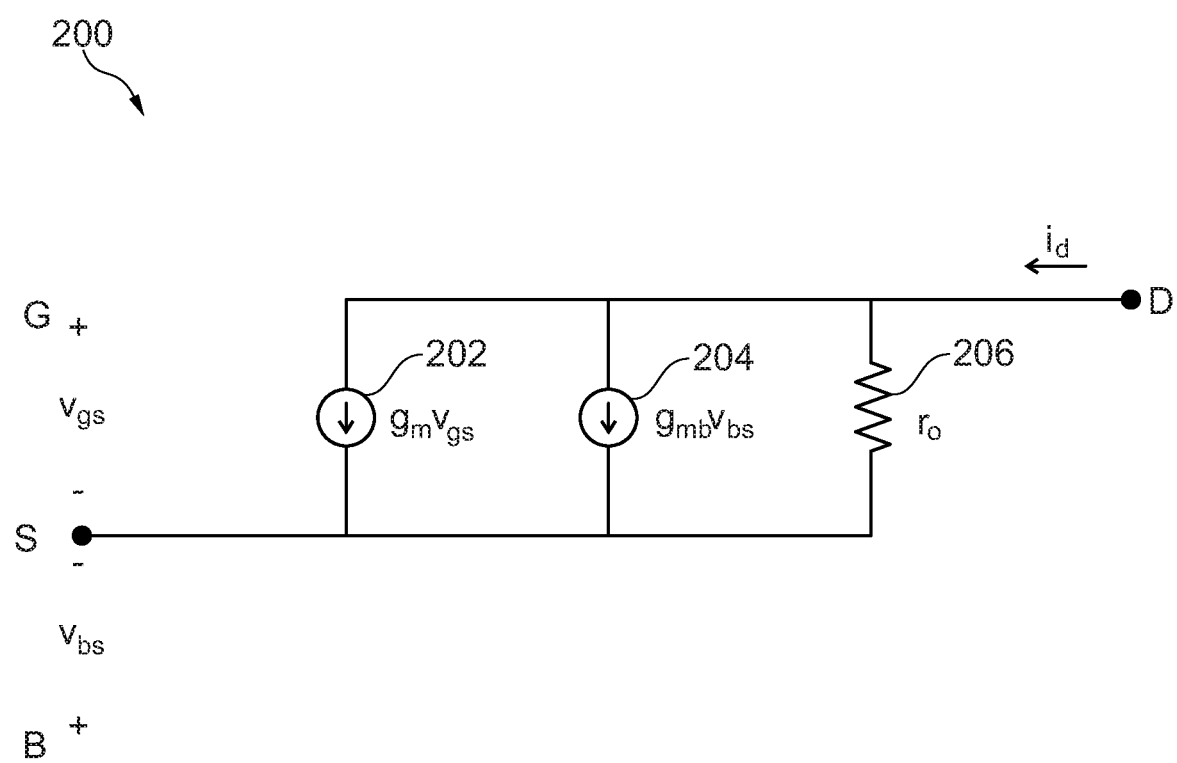
FIG. 2 is a schematic diagram of an equivalent circuit of a source follower transistor in the exemplary MEMS microphone system of FIG. 1.

FIG. 2 is a schematic diagram of an equivalent circuit 200 of a source follower transistor of the exemplary MEMS microphone system of FIG. 1. Source follower transistor Psf is coupled to a gate (G), source (S), bulk (B), and drain (D) nodes previously discussed. The voltage between the gate and source nodes is labeled $V_{gs}$ and the voltage between the bulk and source nodes is labeled $V_{bs}$. The equivalent circuit comprises a first small signal current source 202 having a current $g_m*V_{gs}$ coupled between the drain and source nodes, a second small signal current source $g_{mb}V_{bs}$ coupled between the drain an source nodes, and an output resistor $r_o$ coupled between the drain and source nodes, wherein $g_m$ is the transconductance of the transistor (drain current id divided by the gate to source voltage $V_{gs}$), and wherein $g_{mb}$ is the transconductance of the transistor (drain current id divided by the bulk to source voltage $V_{bs}$). As previously noted, by shorting the bulk node of the transistor to the source node, the bulk controlled transconductance current ($g_m*V_{gs}$) can be eliminated and the potential distortion due to the source follower transistor can be minimized.

Figure 3:
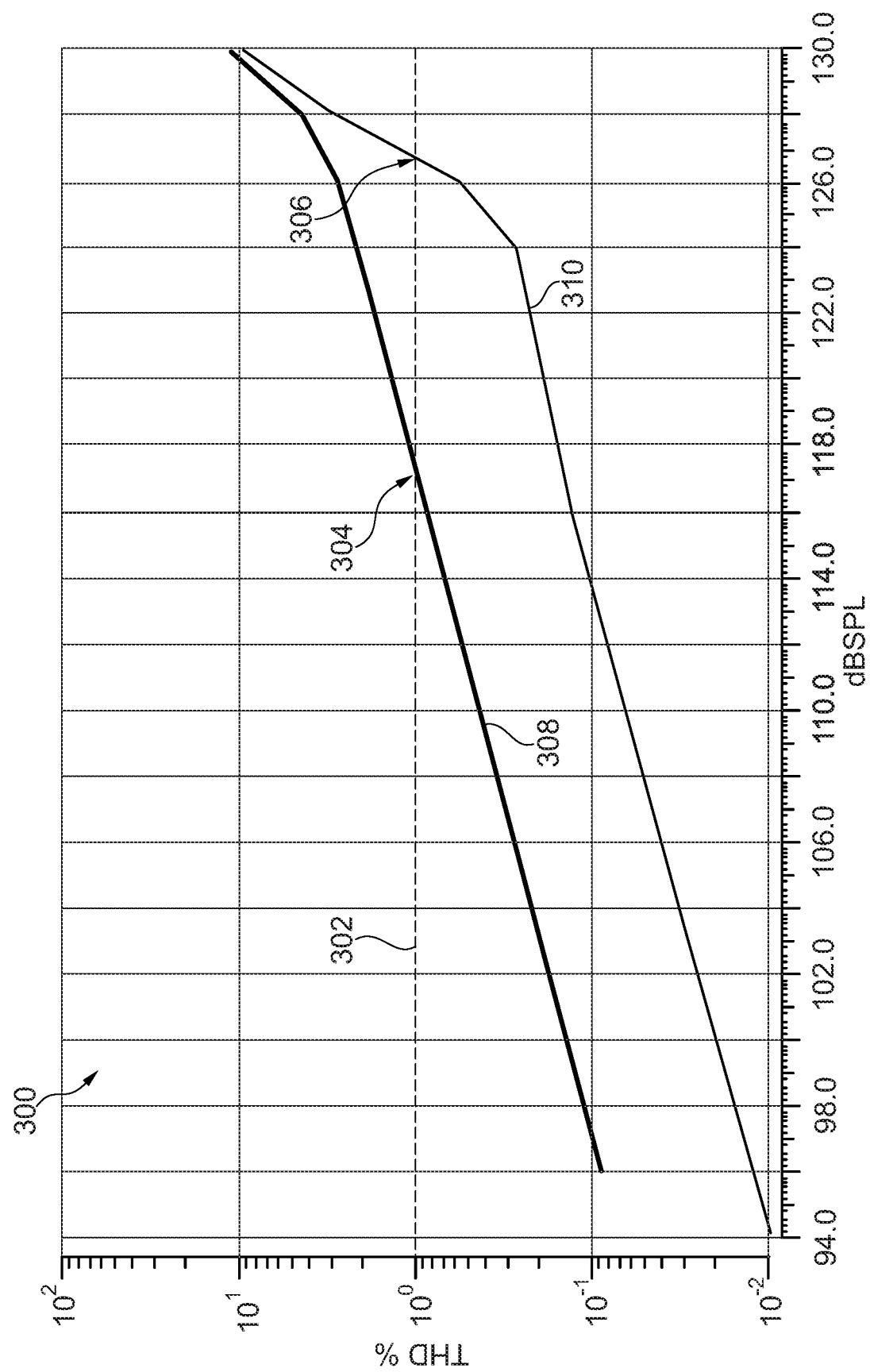
FIG. 3 is a graph of the total harmonic distortion of an ideal MEMS microphone system and the exemplary MEMS microphone system of FIG. 1.

FIG. 3 is a graph 300 of the total harmonic distortion of an ideal MEMS microphone system and the exemplary MEMS microphone (MIC) system of FIG. 1. Curve 308 in FIG. 3 shows the typical THD behavior of a single-ended MEMS MIC system based on the readout circuit shown in FIG. 1. The 1% THD level is shown in FIG. 3 as a horizontal dotted line 302. The sound pressure level at which a 1% THD crossing 304 happens, which is an important specification to a customer, is 118.1dBSPL. In contrast, when using an ideal capacitor to replace the MEMS behavioral model, the 1% crossover 306 happens at 126.5dBSPL of curve 310. In other words, curve 310 shows the THD primarily of the ASIC only. At higher sound pressure levels, distortion increases for both the MEMS MIC system and the ideal MIC system.

Figure 4:
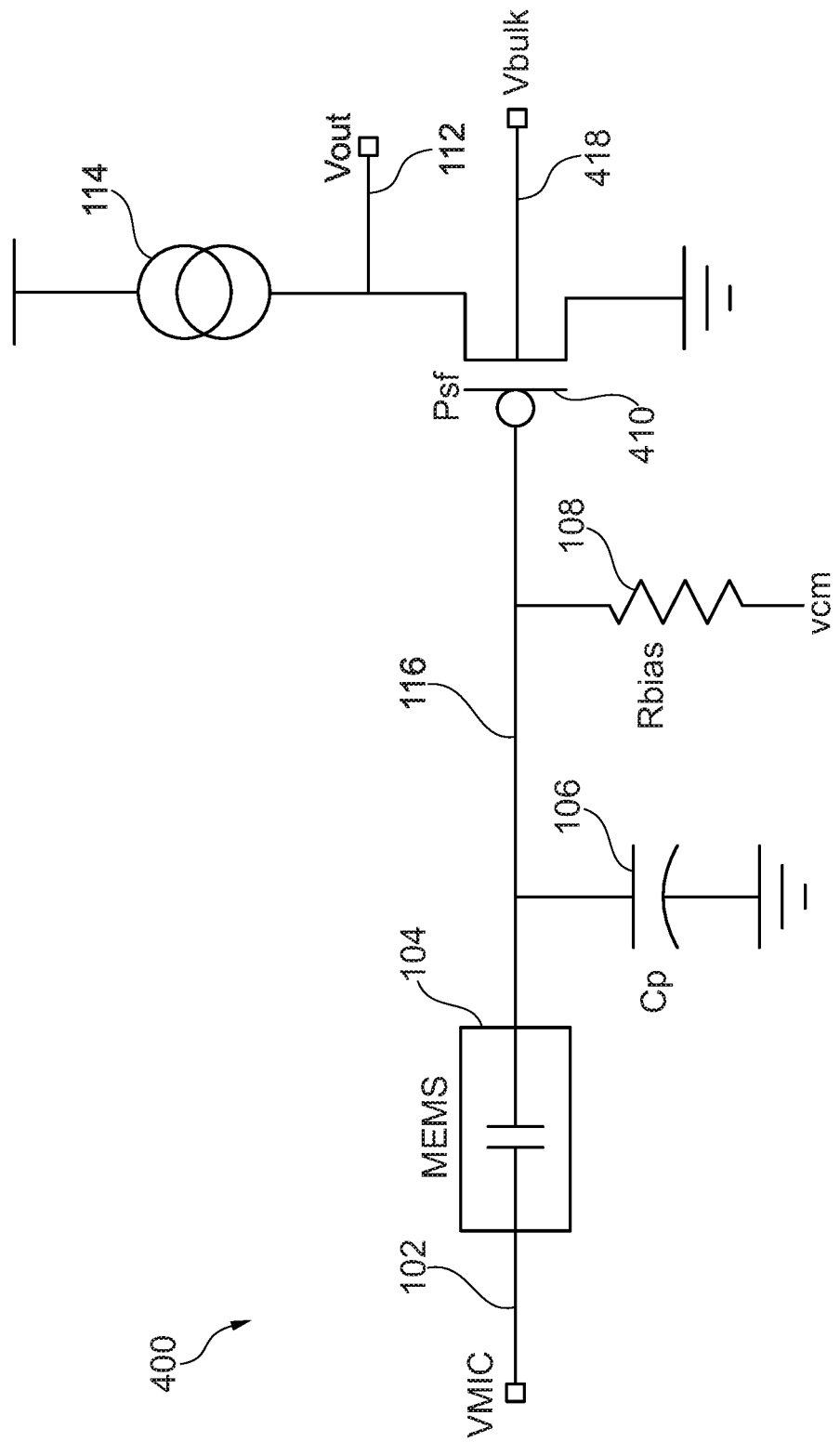
FIG. 4 is a schematic diagram of a MEMS microphone system according to an embodiment.

According to embodiment concepts, a body effect into the PMOS source follower in order to generate a new HD2 distortion component out of the nonlinear product $g_{mb}*V_{bs}$ in the equivalent circuit FIG. 2. In other words, instead of shorting the source node to the bulk node of the PMOS source follower, a fixed DC voltage 'Vbulk' is used to bias the bulk node, as is shown in FIG. 4. Since the extra HD2 introduced here is correlated to $V_{bs}$, different Vbulk levels provide different HD2 distortion components.

FIG. 4 is a schematic diagram of a MEMS microphone system 400 according to an embodiment, including components 104, 106, 108, and 114, previously discussed. MEMS capacitive sensor 104 is coupled between nodes 102 and 116 as previously discussed. The gate of source follower transistor 410 is coupled to node 116, the source is coupled to node 112, and the drain is coupled to ground. However, as noted above the bulk node is no longer shorted to the source node, but is a separate node 418 for receiving Vbulk voltage as noted above. The operation of MEMS microphone system 400 is described in further detail below.

FIG. 5 is a graph 500 of the total harmonic distortion of an ideal MEMS microphone using bulk biasing. FIG. 5 thus shows the THD simulation result using an ideal capacitor MEMS model plus a bulk-biased PMOS source follower transistor, using different Vbulk levels. As expected, compared to the exemplary source-bulk shorted design (curve 510), the THD is degraded due to the bulk effect introduced by the different fixed levels of Vbulk (evidenced by a set of curves 508). Such THD degradation can be proved to be directly proportional to the extra HD2 introduced. The 1% THD level is shown in FIG. 5 as a horizontal dotted line 502. It should be noted that the 1% THD crossing 506 of the source-bulk shorted readout circuit is greater than the 1% THD crossings 504A-504N of the bulk biased readout circuit, indicating degraded distortion characteristics.

Figure 6A:
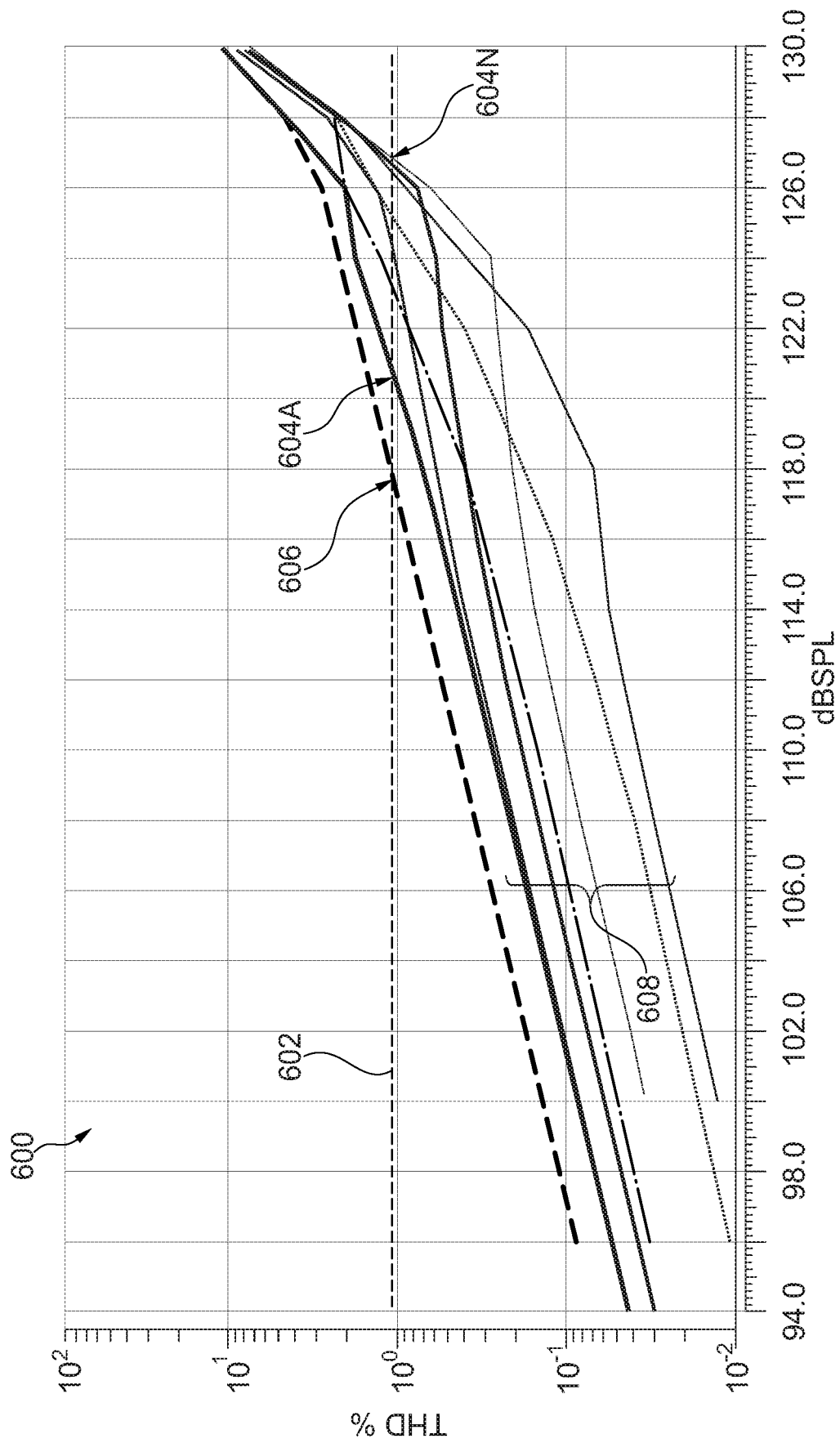
FIG. 6A is a graph of the total harmonic distortion of the MEMS microphone system of FIG. 4.

FIG. 6A is a graph 600 of the total harmonic distortion (THD) of a model of the MEMS microphone system of FIG. 4. The 1% THD level is shown in FIG. 6A as a horizontal dotted line 602. The zero voltage bulk bias 1% THD crossover point 606 is at about 118 dBSPL. A plurality of THD curves 608 for varying bulk voltages, Vbulk, are shown in FIG. 6A. The associated 1% THD crossover points range from a low value 604A to a high value 604N. The plurality of curves vary as the bulk voltage is applied from a low value of Vbulk to a high value of Vbulk. FIG. 6A thus shows, when applying the bulk-biased source follower readout together with a large-signal MEMS model, how the system THDs are affected. By selecting a proper Vbulk voltage, the 1% THD crossover point can be pushed from 118 dBSPL to 125 dBSPL, therefore making a very linear microphone system. In other embodiments described herein the 1% THD crossover point can be pushed by a value of at least ten or fifteen dBSPL.

Figure 6B:
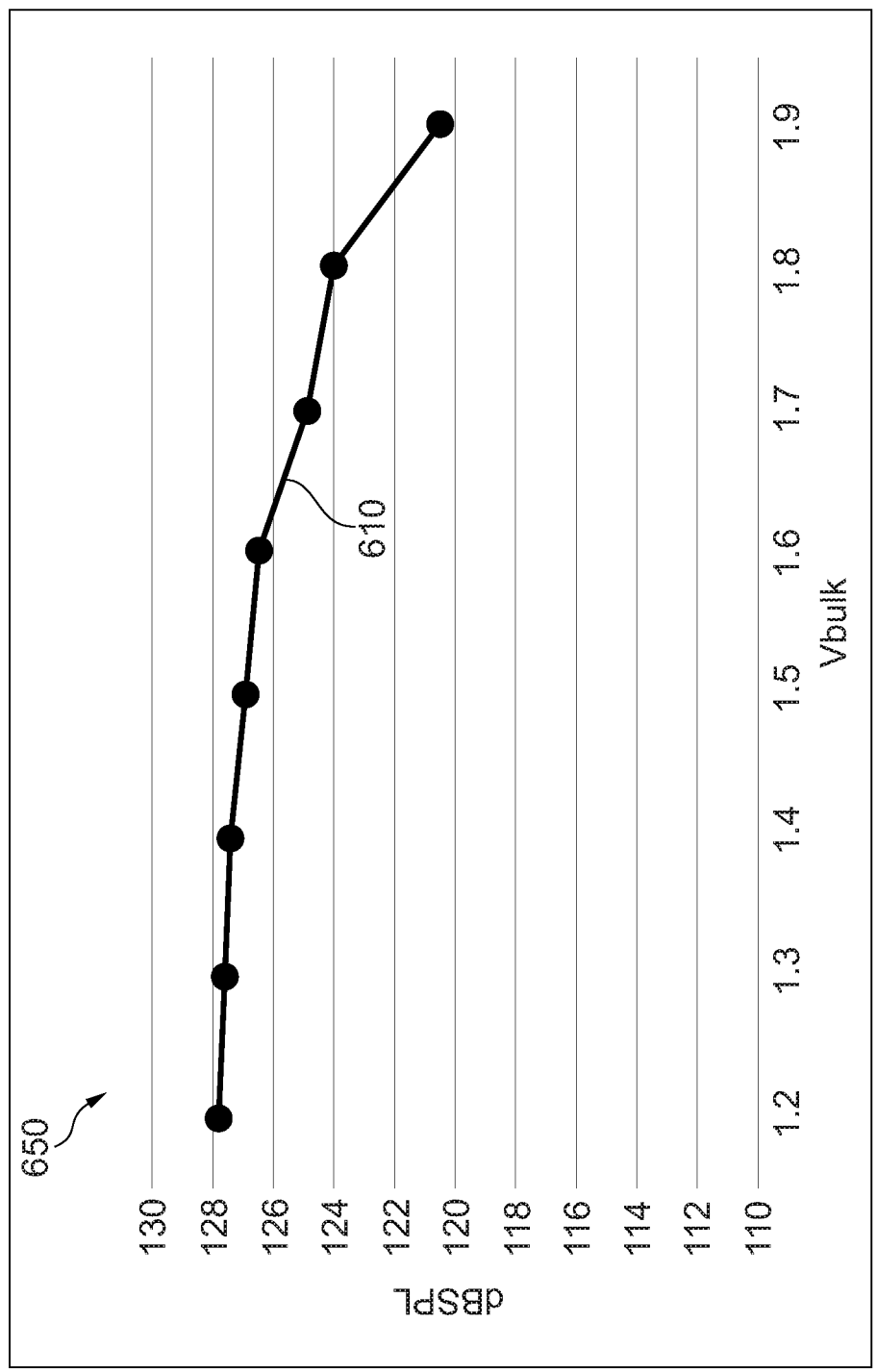
FIG. 6B is a graph of the sound pressure level at which a 1% THD crossing occurs, which is constructed by extracting the data from the graph of FIG. 6A.

FIG. 6B is a graph 650 of the sound pressure level at which a 1% THD crossing occurs, which is constructed by extracting the data from the graph of FIG. 6A, wherein the X-axis is the Vbulk voltage in volts, and the Y-axis is the dBSPL level at which the individual THD curves from the graph 650 of FIG. 6A crosses the 1% level. Curve 610 is thus the sound pressure level versus the Vbulk voltage. Graph 650 thus shows how the Vbulk voltage level affects the 1% THD performance. While curve 610 descends from an optimum dBSPL level of 128 dB at 1.2 volts to a non-optimum dBSPL level of 120 dB at 1.9 volts, different MEMS microphone systems may produce other shaped graphs. For example, other such graphs may have an "upside-down U shape" wherein the optimum value is between a low Vbulk value and a high Vbulk value. Other such graphs may have an ascending shape instead of the descending shape shown in FIG. 6B. The actual shape of the curve depends on the MEMS process corners and the ASIC design parameters. The shape of the curve is also dependent upon the range of bulk voltages that are used.

Figure 7:
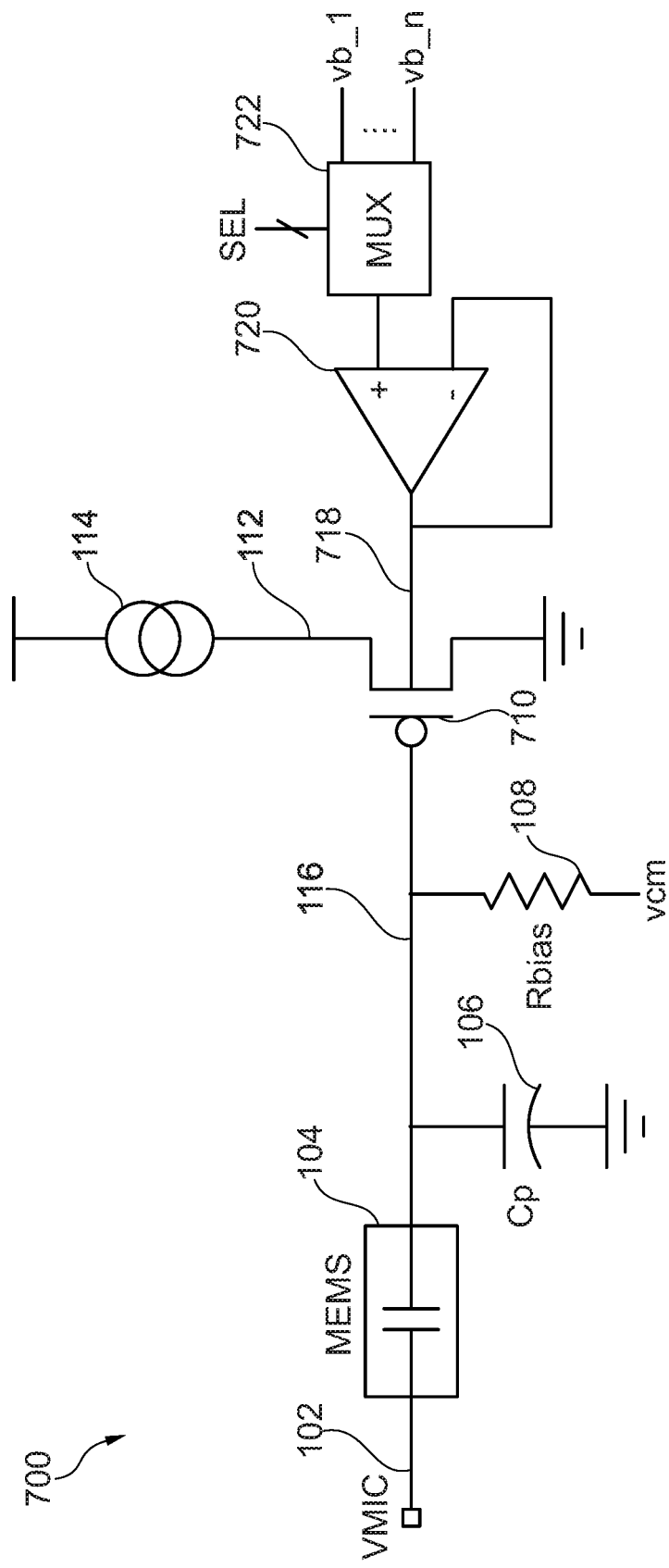
FIG. 7 is a schematic diagram of a MEMS microphone system according to another embodiment.

FIG. 7 shows a detailed schematic diagram of a MEMS microphone system 700 according to an embodiment, including components 104, 106, 108, and 114, previously discussed. MEMS capacitive sensor 104 is coupled between nodes 102 and 116 as previously discussed. The gate of source follower transistor 710 is coupled to node 116, the source is coupled to node 112, and the drain is coupled to ground. However, as noted above the bulk node is no longer shorted to the source node, but is a separate node 418 for receiving Vbulk voltage as noted above. The operation of MEMS microphone system 700 is described in further detail below.

An analog buffer 720 is inserted to isolate the noise generated from the reference circuitry, and a multiplexer 722 is used to select the desired Vbulk voltage. The output of analog buffer 720 is coupled to the bulk node of source follower transistor 710. The input of analog buffer 720 is coupled to the output of multiplexer 722. Multiplexer 722 receives a select signal SEL to select amongst a plurality of bulk node voltages labeled Vb_1 through Vb_n. In an embodiment, a look-up table (LUT) is generated by simulation, in order to list the desired programming code versus different MEMS process corners. An example of different MEMS process corner is described in further detail below. Then during calibration phase, according to the MEMS corner information that is typically available prior to calibration, a calibration code is selected and hard coded on ASIC.

In an embodiment, several DC bulk node biasing voltage levels are prepared on chip (i.e., 8 levels for a 3-bit programming case), for THD calibration. Such calibration is needed to generate a MIC system with optimized THD performance as discussed above. In an embodiment, the calibration method proceeds after determining the "pull-in voltage" of the MEMS device. The bias voltage necessary to collapse the diaphragm to the backplate of the MEMS device is the pull-in voltage, which is given by the equation $Vp=\mathrm{sqrt}(8*k*g_o^3/27*\varepsilon_a*A_e)$, where k is the effective spring constant of the diaphragm, $g_o$ is the air gap at bias voltage of zero, $\varepsilon_a$ is the permittivity of air, and $A_e$ is the effective area of the diaphragm minus the acoustic holes. MEMS microphone sensors can be typically characterized by three process corners: typVp (Vp stands for pull-in voltage of the sensor), highVp and lowVp. The intrinsic distortion of the sensor itself is highly correlated with its process corner. Therefore, a main purpose of the THD calibration is to determine the best bulk voltage level for each MEMS process corner. The MEMS process corner information is included in a MEMS behavioral model, which is used for simulation. Therefore, prior to ASIC fabrication, a look-up table (LUT) can be made by simulation, in order to find an optimized link between the bulk biasing voltage levels and the MEMS corner cases set forth above.

Figure 8:
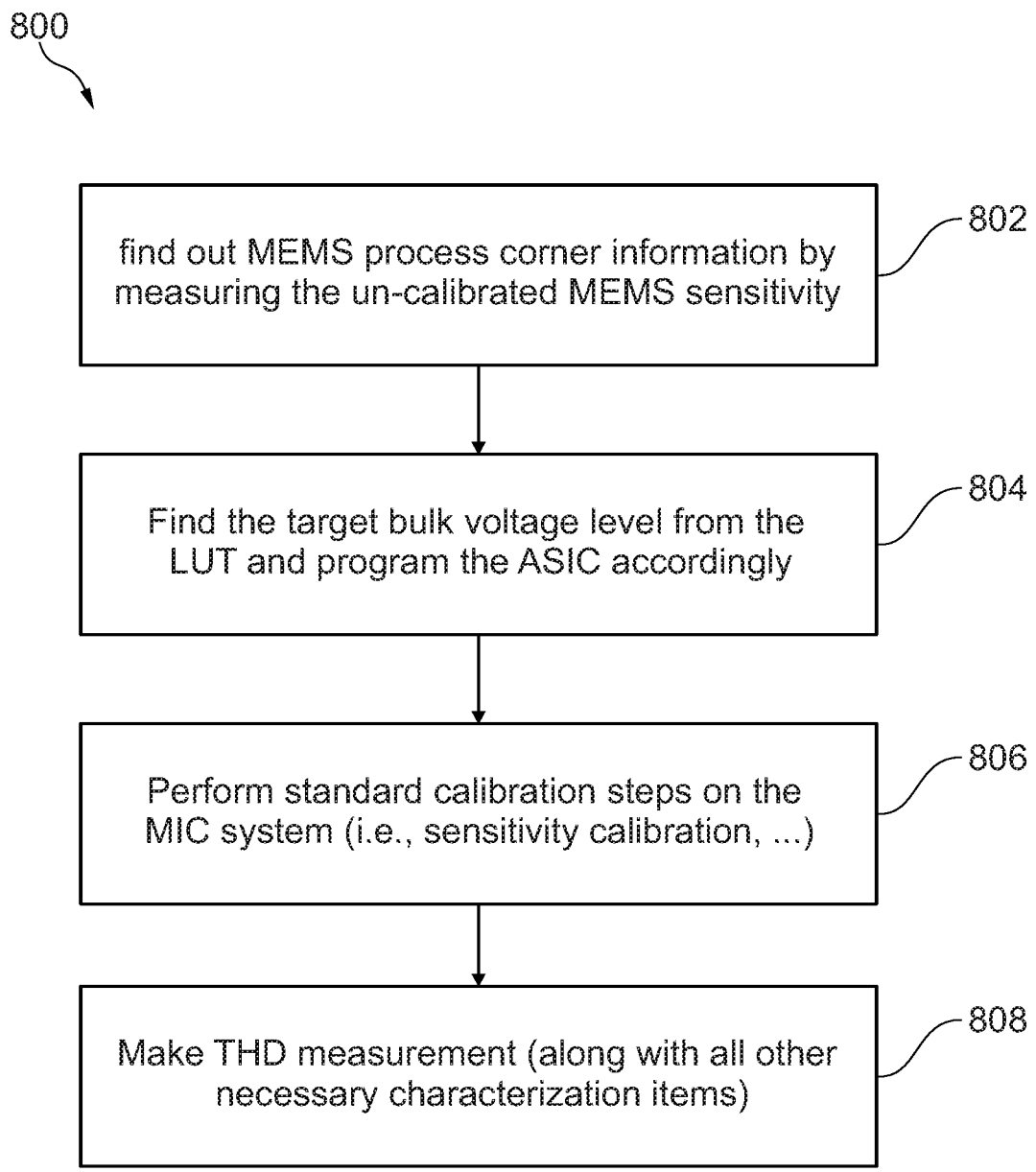
FIG. 8 is a flow chart of a calibration procedure according to an embodiment.

FIG. 8 is a flow chart of a calibration procedure 800 according to an embodiment. The calibration procedure can be typically performed as a "back-end" testing procedure (after the ASIC integrated circuit has been completely fabricated). Calibration procedure 800 comprises the following steps. Determine MEMS process corner information by measuring the un-calibrated MEMS device sensitivity at step 802; determine the target bulk voltage level from the LUT and program the ASIC accordingly at step 804; perform standard calibration steps on the MIC system (i.e., sensitivity calibration, . . . ) at step 806; and perform the THD measurement (along with all other necessary characterization items) at step 808.

Figure 9:
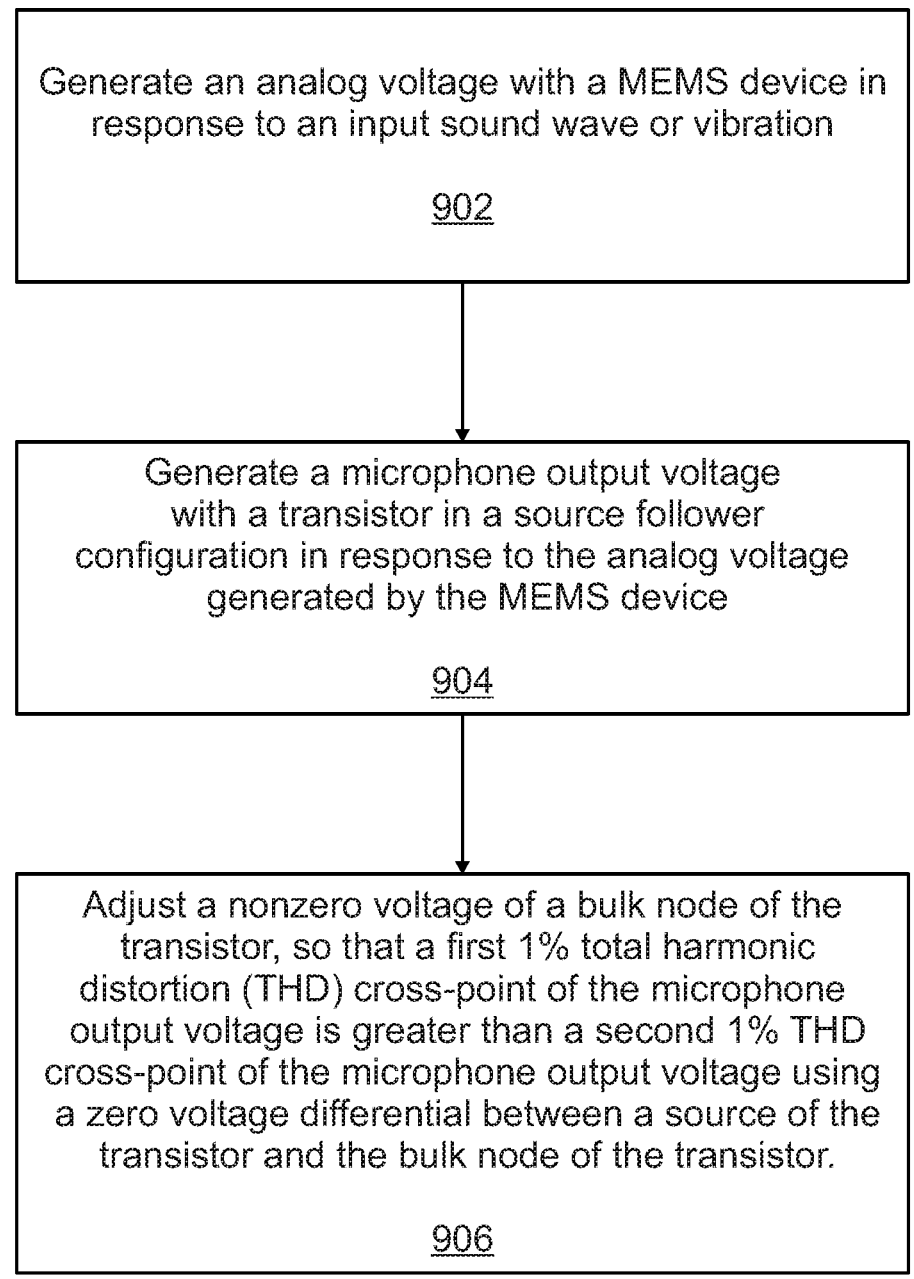
FIG. 9 is a flow chart of a linearization method applied to a MEMS microphone system according to an embodiment.

FIG. 9 is a flow chart of a linearization method applied to a MEMS microphone system according to an embodiment, wherein the method comprises generating an analog voltage with a MEMS device in response to an input sound wave or vibration at step 902; generating a microphone output voltage with a transistor in a source follower configuration in response to the analog voltage generated by the MEMS device at step 904; and adjusting a nonzero voltage of a bulk node of the transistor, so that a first 1% total harmonic distortion (THD) cross-point of the microphone output voltage is greater than a second 1% THD cross-point of the microphone output voltage using a zero voltage differential between a source of the transistor and the bulk node of the transistor at step 906.

Example embodiments of the present invention are summarized here. Other embodiments can also be understood from the entirety of the specification and the claims filed herein.

Example 1. According to an embodiment, a microphone includes a MEMS device having an output node for generating an analog voltage in response to an input sound wave or vibration; a source follower having a control node coupled to the output node of the MEMS device, a current path coupled between a first controlled node and a second controlled node, and a bulk node, wherein the first controlled node is configured for providing a microphone output voltage, and wherein the second controlled node is coupled to a reference voltage; a current source coupled to the first controlled node; and a voltage differential between the first controlled node and the bulk node, wherein a nonzero value of the voltage differential is configured such that a first 1% total harmonic distortion (THD) cross-point of the microphone output voltage is greater than a second 1% THD cross-point of the microphone output voltage using a zero value voltage differential.

Example 2. The microphone of Example 1, wherein the nonzero value of the voltage differential is configured such that the first 1% THD cross-point of the microphone output voltage is at least ten decibels greater than the second 1% THD cross-point of the microphone output voltage.

Example 3. The microphone of any of the above examples, wherein the nonzero value of the voltage differential is configured such that the first 1% THD cross-point of the microphone output voltage is at least fifteen decibels greater than the second 1% THD cross-point of the microphone output voltage.

Example 4. The microphone of any of the above examples, wherein the source follower includes a PMOS transistor.

Example 5. The microphone of any of the above examples, wherein the voltage differential includes an adjustable voltage differential.

Example 6. The microphone of any of the above examples, further including a bias resistor coupled to the control node of the source follower.

Example 7. According to an embodiment, a microphone includes a MEMS device having an output node for generating an analog voltage in response to an input sound wave or vibration; a source follower having a control node coupled to the output node of the MEMS device, a current path coupled between a first controlled node and a second controlled node, and a bulk node, wherein the first controlled node is configured for providing a microphone output voltage, and wherein the second controlled node is coupled to a reference voltage; a current source coupled to the first controlled node; and a multiplexer having a plurality of inputs configured for receiving a respective plurality of predetermined bulk voltages, and an output coupled to the bulk node of the source follower, wherein one of the predetermined bulk voltages is selected so that a first 1% total harmonic distortion (THD) cross-point of the microphone output voltage is greater than a second 1% THD cross-point of the microphone output voltage using a zero value voltage differential between a source node of the source follower and the bulk node of the source follower.

Example 8. The microphone of claim 7, wherein a selected predetermined bulk voltage is configured such that the first 1% THD cross-point of the microphone output voltage is at least ten decibels greater than the second 1% THD cross-point of the microphone output voltage.

Example 9. The microphone of any of the above examples, wherein a selected predetermined bulk voltage is configured such that the first 1% THD cross-point of the microphone output voltage is at least fifteen decibels greater than the second 1% THD cross-point of the microphone output voltage.

Example 10. The microphone of any of the above examples, wherein the source follower includes a PMOS transistor.

Example 11. The microphone of any of the above examples, further including a buffer amplifier interposed between the multiplexer and the source follower.

Example 12. The microphone of any of the above examples, further including an attenuation component coupled between the buffer amplifier and the source follower.

Example 13. According to an embodiment, a method includes generating an analog voltage with a MEMS device in response to an input sound wave or vibration; generating a microphone output voltage with a transistor in a source follower configuration in response to the analog voltage generated by the MEMS device; and adjusting a nonzero voltage of a bulk node of the transistor, so that a first 1% total harmonic distortion (THD) cross-point of the microphone output voltage is greater than a second 1% THD cross-point of the microphone output voltage using a zero voltage differential between a source of the transistor and the bulk node of the transistor.

Example 14. The method of claim 13, wherein the nonzero voltage of the bulk node of the transistor is adjusted such that the first 1% THD cross-point of the microphone output voltage is at least ten decibels greater than the second 1% THD cross-point of the microphone output voltage.

Example 15. The method of any of the above examples, wherein the nonzero voltage of the bulk node of the transistor is adjusted such that the first 1% THD cross-point of the microphone output voltage is at least fifteen decibels greater than the second 1% THD cross-point of the microphone output voltage.

Example 16. The method of any of the above examples, wherein the transistor includes a PMOS transistor.

Example 17. The method of any of the above examples, wherein adjusting the nonzero voltage of the bulk node of the transistor includes selecting the nonzero voltage from a plurality of predetermined candidate voltages.

Example 18. The method of any of the above examples, wherein the predetermined candidate voltages correspond to a specific MEMS device and/or a specific transistor.

Example 19. The method of any of the above examples, wherein the predetermined candidate voltages are selected from a lookup table (LUT).

Example 20. The method of any of the above examples, wherein the method is performed in a digital microphone including additional signal processing components.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A microphone comprising:
   a MEMS device having an output node for generating an analog voltage in response to an input sound wave or vibration;
   a source follower having a control node coupled to the output node of the MEMS device, a current path coupled between a first controlled node and a second controlled node, and a bulk node, wherein the first controlled node is configured for providing a microphone output voltage, and wherein the second controlled node is coupled to a reference voltage;
   a current source coupled to the first controlled node; and
   a voltage differential between the first controlled node and the bulk node, wherein a nonzero value of the voltage differential is configured such that a first 1% total harmonic distortion (THD) cross-point of the microphone output voltage is greater than a second 1% THD cross-point of the microphone output voltage using a zero value voltage differential.

2. The microphone of claim 1, wherein the nonzero value of the voltage differential is configured such that the first 1% THD cross-point of the microphone output voltage is at least ten decibels greater than the second 1% THD cross-point of the microphone output voltage.

3. The microphone of claim 1, wherein the nonzero value of the voltage differential is configured such that the first 1% THD cross-point of the microphone output voltage is at least fifteen decibels greater than the second 1% THD cross-point of the microphone output voltage.

4. The microphone of claim 1, wherein the source follower comprises a PMOS transistor.

5. The microphone of claim 1, wherein the voltage differential comprises an adjustable voltage differential.

6. The microphone of claim 1, further comprising a bias resistor coupled to the control node of the source follower.

7. A microphone comprising:
   a MEMS device having an output node for generating an analog voltage in response to an input sound wave or vibration;
   a source follower having a control node coupled to the output node of the MEMS device, a current path coupled between a first controlled node and a second controlled node, and a bulk node, wherein the first controlled node is configured for providing a microphone output voltage, and wherein the second controlled node is coupled to a reference voltage;

a current source coupled to the first controlled node; and a multiplexer having a plurality of inputs configured for receiving a respective plurality of predetermined bulk voltages, and an output coupled to the bulk node of the source follower, wherein one of the predetermined bulk voltages is selected so that a first 1% total harmonic distortion (THD) cross-point of the microphone output voltage is greater than a second 1% THD cross-point of the microphone output voltage using a zero value voltage differential between a source node of the source follower and the bulk node of the source follower.

8. The microphone of claim 7, wherein a selected predetermined bulk voltage is configured such that the first 1% THD cross-point of the microphone output voltage is at least ten decibels greater than the second 1% THD cross-point of the microphone output voltage.

9. The microphone of claim 7, wherein a selected predetermined bulk voltage is configured such that the first 1% THD cross-point of the microphone output voltage is at least fifteen decibels greater than the second 1% THD cross-point of the microphone output voltage.

10. The microphone of claim 7, wherein the source follower comprises a PMOS transistor.

11. The microphone of claim 7, further comprising a buffer amplifier interposed between the multiplexer and the source follower.

12. The microphone of claim 11, further comprising an attenuation component coupled between the buffer amplifier and the source follower.

13. A method comprising:

generating an analog voltage with a MEMS device in response to an input sound wave or vibration;

generating a microphone output voltage with a transistor in a source follower configuration in response to the analog voltage generated by the MEMS device; and adjusting a nonzero voltage of a bulk node of the transistor, so that a first 1% total harmonic distortion (THD) cross-point of the microphone output voltage is greater than a second 1% THD cross-point of the microphone output voltage using a zero voltage differential between a source of the transistor and the bulk node of the transistor.

14. The method of claim 13, wherein the nonzero voltage of the bulk node of the transistor is adjusted such that the first 1% THD cross-point of the microphone output voltage is at least ten decibels greater than the second 1% THD cross-point of the microphone output voltage.

15. The method of claim 13, wherein the nonzero voltage of the bulk node of the transistor is adjusted such that the first 1% THD cross-point of the microphone output voltage is at least fifteen decibels greater than the second 1% THD cross-point of the microphone output voltage.

16. The method of claim 13, wherein the transistor comprises a PMOS transistor.

17. The method of claim 13, wherein adjusting the nonzero voltage of the bulk node of the transistor comprises selecting the nonzero voltage from a plurality of predetermined candidate voltages.

18. The method of claim 17, wherein the predetermined candidate voltages correspond to a specific MEMS device and/or a specific transistor.

19. The method of claim 17, wherein the predetermined candidate voltages are selected from a lookup table (LUT).

20. The method of claim 13, wherein the method is performed in a digital microphone including additional signal processing components.

* * * * *